United States Patent [19]

Magno et al.

[11] 3,993,949
[45] Nov. 23, 1976

[54] METHOD AND APPARATUS FOR DETECTING NON-PARALLEL REED SWITCH CONTACTS

[76] Inventors: Douglas J. Magno, 7460 Seward St., Niles, Ill. 60648; Frank Bing, Jr., 258 W. Alexander, Chicago, Ill. 60616

[22] Filed: Mar. 27, 1975

[21] Appl. No.: 563,005

[52] U.S. Cl. .......................... 324/28 R; 324/28 SE
[51] Int. Cl.² ...................................... G01R 31/02
[58] Field of Search ........... 324/28 R, 28 CH, 28 SE

[56] References Cited
UNITED STATES PATENTS
3,803,480   4/1974   Goldbach .................... 324/28 SE OTHER PUBLICATIONS
Erickson, "Measuring Relay Contact–Bounce," vol. 23, No. 6, Electronic Industries, June 1964, pp. 206, 207, 216–218.

Heilweil, "Testing Electromagnetic Switching Devices," IBM Tech. Bul., vol. 9, No. 4, Sept. 1966, p. 367.

Primary Examiner—R. V. Rolinec
Assistant Examiner—Michael J. Tokar

[57] ABSTRACT

A method and apparatus for use in detecting non-parallel reed switch contacts, comprising digital circuitry for measuring the durations of contact bounces (open contact states) after the initial operation or closure of the reed switch contacts and a comparator stage; the output of the digital measuring circuitry is applied to the comparator stage which determines if the duration of any contact bounce is greater than or less than a digitally programmed reference number corresponding to a duration for an acceptable reed switch. Reed switch operating circuitry is also provided to operate and deactuate the reed switch contacts for a predetermined number of test cycles.

8 Claims, 2 Drawing Figures

– 3,993,949 –

METHOD AND APPARATUS FOR DETECTING NON-PARALLEL REED SWITCH CONTACTS

BACKGROUND OF THE INVENTION

1. Field of the Invention

The present invention relates generally to the field of reed switch testing and in particular to an improved method and apparatus for use in detecting non-parallel reed switch contacts by measuring the duration or pulse width of each contact bounce after the initial operation or closure of the reed switch contacts and comparing each open contact duration to a programmed reference number corresponding to an acceptable duration.

2. Description of the Prior Art

In the manufacturing of reed switch devices it is necessary to identify reed switches that have non-parallel contacts, generally called bad mating parts. These non-parallel contact switches usually have one reed member or blade twisted axially which produces a line contact instead of the desired surface contact between the reed members. This undesirable line contact gives a high but acceptable electrical contact resistance and yet may still cause an ultimate failure in the operation of the switch after operating in the field.

Various testing methods have been developed to detect these potential failure parts including the visual sorting one-by-one which of course includes the inherent disadvantage of the varying visual perception of the testing personnel. Electrical testing apparatus has been developed that applies a linearly changing current simultaneously to an operating coil and to its reed blades and then differentiating the voltage developed across the contacts to determine the operating characteristics of the switch such as those of the type described in U.S. Pat. No. 3,586,961, which issued to R. M. Rovnyak on June 22, 1971 and U.S. Pat. No. 3,822,398, which issued to R. M. Rovnyak on July 2, 1974. These techniques however do not make use of the contact bounce time to determine badly mated contacts.

Other relay testing circuits of the prior art measure various parameters such as the length of time that the contacts continue to chatter after initial closure, the number of bounce pulses present after closure, and the accumulative bounce time such as disclosed in U.S. Pat. No. 2,236,157, which issued to W. T. Rea on Mar. 25, 1941, U.S. Pat. No. 1,677,157, which issued to A. Weaver on July 17, 1928, U.S. Pat. No. 3,612,985, which issued to A. F. Rockett on Oct. 12, 1971, and U.S. Pat. No. 3,241,063, which issued to C. L. Beattie et al. on Mar. 15, 1966.

Other prior art circuits have been devised to measure the pulse duration of a contact bounce as compared to a predetermined level by the use of capacitor charge and discharges such as disclosed in U.S. Pat. No. 3,364,419, which issued to G. D. Anderson on Jan. 16, 1968 and in an article entitled "Relay Contact Bounce Measurements", by Richard Jiu in Electronics Magazine, August, 1955 issue. Such circuits however do not include digital techniques that allow for the programming of various reference time durations. Further, this type of RC time constant measurement is also less accurate than those obtained by digital techniques.

OBJECTS AND SUMMARY OF THE INVENTION

Accordingly it is a principal object of the present invention to provide a method and apparatus for detecting nonparallel reed switch contacts that utilizes digital measuring circuitry and digital comparing circuitry for accurately and efficiently measuring the duration of each contact bounce or open contact state after initial closure of the reed switch contacts and comparing each contact bounce pulse duration with a digitally programmed reference duration to provide an output indicating whenever any of said open contact durations exceeds the reference duration.

Another object of the present invention is to provide an apparatus for operating the reed switch for a predetermined number of test cycles to detect an open contact pulse duration in any of the test cycles which exceeds the reference duration.

Another object of the present invention is a detecting apparatus which measures the open contact pulse width durations for a predetermined time interval after initial closure of the reed switch.

Another object of the present invention is to provide an output signal corresponding to the pulse width duration of each open contact cycle.

These and other objectives of the present invention are achieved by providing digital circuitry for measuring the duration of each bounce or open contact state after initial closure of a reed switch under test for a given calculation time period interval and digital comparison circuitry having a digitally programmed reference duration and providing an output indicating whether any of the open contact duration intervals exceeded the digitally programmed reference duration. The digital measuring circuitry includes a counter stage which is driven by clock circuitry with the counter stage being enabled during the duration of each open contact state and providing an output to the comparison circuitry corresponding to the time duration of each open contact state during a test cycle. Reed switch operating circuitry is also provided to operate and deactuate the reed switch contacts for a predetermined number of test cycles. An accept indication output is provided at the end of the predetermined number of test cycles indicating that none of the open contact duration intervals during any of the test cycles exceeded the digitally programmed reference duration and a reject indication is provided when any of the open contact durations exceeds the digitally programmed reference duration.

Other objects will appear from time to time in the ensuing specification, drawings, and claims.

DESCRIPTION OF THE PREFERRED EMBODIMENT

Figure 1:
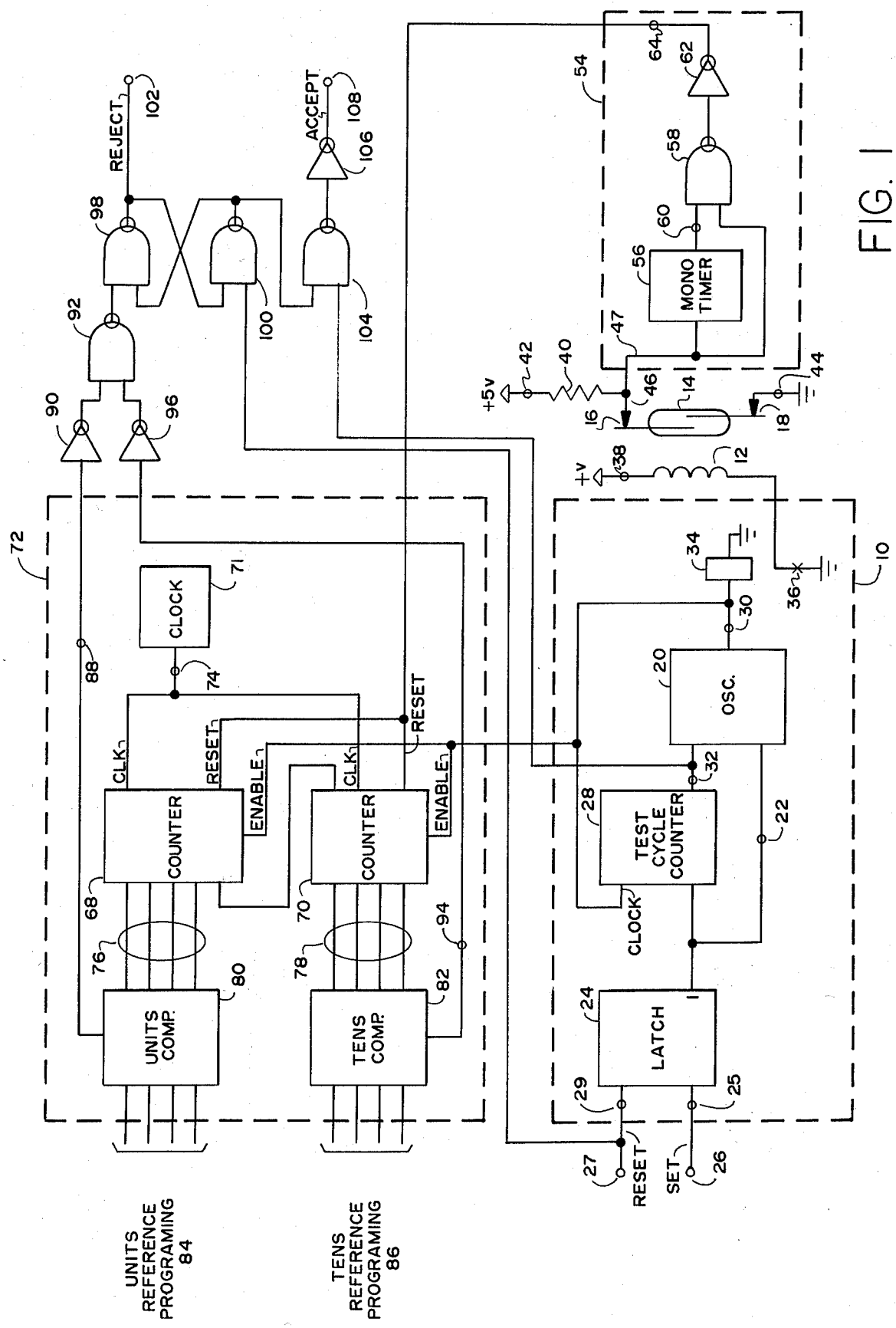
FIG. 1 is a schematic diagram representation of the apparatus utilized in detecting non-parallel reed switch contacts of the present invention.

The detection apparatus of FIG. 1 utilizes reed switch operating means 10 to control the actuation of the test coil 12 associated with the reed switch 14 under test. The reed switch 14 under test is placed into a test connector shown as contacts 16, 18. The reed switch operating means 10 includes an oscillator circuit 20 operating with a nominal period of 100 milliseconds of approximately 50 percent duty cycle and is controlled by the set output of latch 24 which has an input set connected to terminal 26 via line 25 and actuated by a first bush-button which is not shown. The reset input of the latch 24 is connected to terminal 27 via line 29 and actuated by a second push-button switch which is not shown. Upon operation of the first push-button switch, a signal is applied to the set input of the latch 24, via line 25 and terminal 26. In response thereto latch 24 produces a start signal at 22 to the oscillator 20 and also a reset signal to the test cycle counter 28. The oscillator 20 then continues to operate for a predetermined number of cycles as determined by the test cycle counter 28 which counts the oscillator output signal 30 at the clock input of the test cycle counter 28. After the predetermined number of test cycles have been outputted from the oscillator 20, the test cycle counter 28 produces an output signal 32 which disables the oscillator 20 until the next set signal at terminal 26 is received. The output 30 of the test oscillator 20 also operates a relay 34 with contacts for controlling current flow through the test coil 12 which is connected to a supply voltage via terminal 38. As the oscillator 20 produces a series of pulses, relay 34 then actuates and deactuates the test coil 12 of the reed switch 14 under test for the predetermined number of cycles.

The reed switch 14 under test is connected through a resistor 40 to a supply voltage via the terminal 42 and to ground 44 through the contacts 16, 18 respectively. When the reed switch 14 is operated by the test coil 12, the voltage at point 16 changes state from a high level to a low level upon initial closure and produces an operate bounce pulse wave-form at terminal 46 shown as wave-form 146 in FIG. 2 as the contacts of the reed switch 14 open and close. This bounce pattern varies for each individual reed switch 14 under test both in the number of bounce pulses or open contact pulses after initial closure and also the pulse or time duration of each bounce pulse. For example three representative bounce pulses are shown in the wave-form 146 of FIG. 2 as a first short duration contact bounce pulse 148, a second longer duration bounce pulse 150, and a third relatively short bounce pulse 152. It should be understood that there is a certain amount of bounce pulse or open contact behavior after initial closure exhibited in all reed switches. These bounce pulses are dampened quickly in reed switches which have properly mating and parallel contacts. In those reed switches in which the reed members or blades are not properly mated or are non-parallel, usually having one blade twisted axially, a line contact effect is produced instead of the desired surface contact. In these cases the twist in the blade will tend to store a degree of torsional energy and therefor cause the contacts to separate momentarily or bounce. The contact bounce in most reed switches normally occurs within the first 500 microseconds after the initial closure. The duration of the actual open or non-contact interval of a single bounce pulse varies from approximately 0.5 microseconds in properly mating switches to over 70 microseconds in poorly mating or non-parallel contact switches. This bounce pulse width, such as pulse 50, then determines if the reed switch under test exhibits properly mating contact behavior. The longer the duration of the contact bounce pulse the greater the degree of improper mating. Variations in reed blade stiffness tend to cause random bounce patterns among the various poorly mating contacts of various switches. Generally, however, reed switches show a constantly decreasing bounce pattern due to dampening between the reed members.

Figure 2:
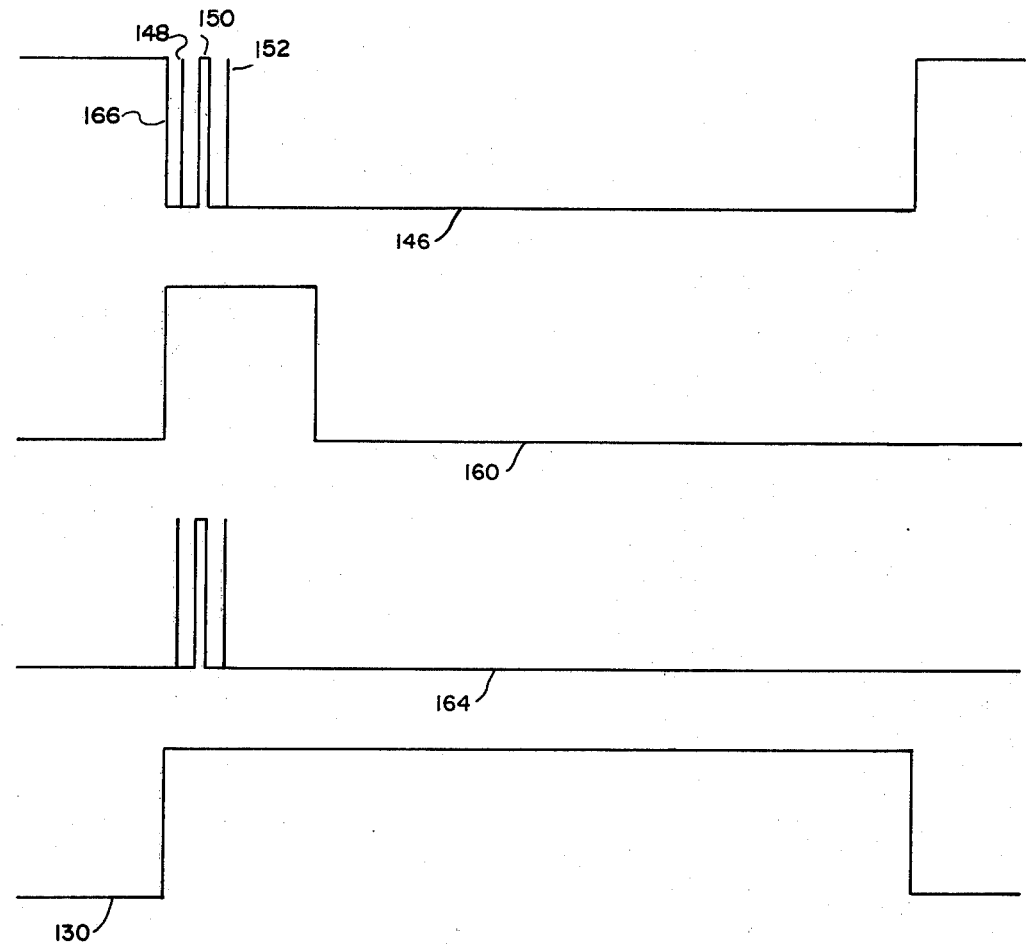
FIG. 2 is a timing diagram of various wave-forms throughout the detection apparatus of FIG. 1.

The reed switch contact at 16 is connected via line 47 to a pulse timing and gating means stage 54 and the contact bounce wave-form 146 of FIG. 2 is applied to a programmable monostable stage 56 and to one input of a two input NAND gate 58. The output of the monostable stage 56 is connected via the line 60 to the other input of the two input NAND gate 58 whose output is connected through an inverter gate 62 forming a reset signal on the line 64. The output wave-form of the monostable 56 applied to line 60 and shown as wave-form 160 in FIG. 2 changes state to a high level or is triggered by the falling edge 166 of the wave-form at terminal 46 as shown in the wave-form 146 in FIG. 2. The pulse duration of the monostable stage 56 is set for approximately 10 milliseconds. During the time in which the monostable circuit output is at a high logic level, the NAND gate 58 is enabled to produce an output at terminal 64 during the time duration when the contacts of the reed switch 14 are in a open state during each bounce after the initial closure indicated at wave-form 166 of FIG. 2. The output of the pulse timing and gating means stage 54 is coupled via line 64 to the reset inputs of two digital counter stages 68 and 70 of the digital measuring means stage 72. The clock inputs of counter stages 68 and 70 are driven by the output on line 74 of clock circuit 76 of digital which is utilized as a time reference for the digital measuring means circuitry 72. The counters 68 and 70 are interconnected in cascade such that counter 68 is the units counter with its ripple carry output connected to the carry count enable input of counter 70 which functions as the 10's counter. The BCD outputs of unit counter 68 which are applied to the lines 76 then provide an output corresponding to the units of microseconds of each operate bounce pulse and the BCD output of the 10's counter 70 which are applied to the lines 78 then provides an output in 10's of microseconds of the operate bounce pulse duration.

The BCD output on the lines 76 of the units counter 68 and the BCD output on the lines 78 of the 10's counter 70 are fed to a unit comparator stage 80 and a 10's comparator stage 82, respectively. The units comparator stage 80 includes BCD units reference programming lines 84 and the 10's comparator stage 82 includes included 10's referencing programming lines 86 on which the acceptable time duration of a contact bounce pulse is programmed in microseconds utilizing a BCD code. The outputs of comparator stages 80 and 82 are normally at a high or one logic level whenever the encoded levels on lines 84 and 86 of the reference words are > (greater than) the inputs from counters 68 and 70. Correspondingly when the counter outputs exceed the referencing programming words, the outputs change to a zero or low level logic state corresponding to a time duration of the contact bounce interval being > (greater than) the desired or acceptable reference limit. The output 88 of comparator 80 is coupled through an inverter gate 90 to one input of a two input NAND gate 92 and the output 94 of comparator stage 82 is coupled through inverter gate 96 to the other input of NAND gate 92. The output of gate 92 is connected to one input of a two input NAND gate 98 of an output latch circuit. The second input of NAND gate 98 is connected to the output of two input NAND gate 100 of the latch circuitry and the output of gate 98 is connected to one input of gate 100. The second input of NAND gate 100 is connected to the reset start input terminal 27 of the reed switch operating means cicuitry 10. When the reed switch reset input is actuated by a signal at input terminal 27 the latch formed by gates 98 and 100 is set so that the output 102 of NAND gate 98 which forms the reject output indication is at a low logic state and the output of gate 100 is at a high logic level. The output of gate 100 is also connected to one input of a two input NAND gate 104 whose second input is connected to the disable output 32 of test cycle counter 28. The output of NAND gate 104 is connected through an inverter gate 106 whose output 108 is the accept output indication.

In operation the counters 68 and 70 are enabled after the reed switch 14 has operated and are thereafter enabled for the duration of each bounce pulse wherein they advance or count to the binary number corresponding to the pulse width in microseconds. This binary measurement at the outputs 76 and 78 of the counters 68 and 70 are then compared to the acceptable binary number programmed into the comparator stages 80 and 82. If any one bounce pulse duration exceeds the acceptable programmed reference input in any one of the predetermined number of test cycles, the inputs to NAND gate 92 will be high thereby setting the latch circuitry of NAND gates 98 and 100 to a high logic level at the reject indicator output 102. If none of the contact pulse width durations exceed the referenced inputs at the end of the predetermined number of test cycles, the output of gate 100 of the latch will be a high logic level. When the test cycle counter output 32 which disables the test oscillator switches to a high logic level, as shown in the wave-form 130 of FIG. 2, the accept output indication will indicate a high level at the completion of the last test cycle.

The method and apparatus for detecting non-parallel reed switch contacts of the present invention then measure every bounce pulse width and compare this pulse width to the programmed reference inputs corresponding to acceptable pulse width measurements to provide an accept or reject level during a predetermined number of test cycles for each reed switch under test. For automated testing ease of a variety of reed switches which exhibit differing acceptable pulse width measurements, the units and 10's referencing programming inputs 84 and 86 may be connected to thumb wheel switches or other suitable programming inputs to allow for efficient testing of any desired acceptable pulse width duration. It should also be understood that the outputs of counters 68 and 70 at BCD lines 76 and 78 provide a continuous indication of the pulse width duration of each contact bounce or open contact state after initial closure during the various test cycles. Further, the method and apparatus for detecting non-parallel contacts in reed switches may be utilized with one test cycle as well as for any predetermined number of test cycles by the modification of the reed switch operating means circuitry 10. The variable programming of the time duration of the monostable 56 in the pulse timing and gating means 54 may also be modified to interrogate the pulse width of contact bounces during any predetermined time after initial closure of the reed switch under test.

The following list of circuit components have been found suitable for operation of the invention, but should not be interpreted as limiting the design or function of the invention: Test cycle counter 28, Texas Instrument Ser. No. 74160; decode counter; Test Oscillator 20, 2 Texas Instrument Ser. No. 74121 Monostable Multivibrator; Counters 68 and 70, Texas Instrument Ser. No. 74160 decode counter; Comparators 80 and 82, Fairchild 9324; Monostable timer 56, Texas Instrument 74121; NAND gates 58, 92, 98, 100, and 104, Texas Instrument Ser. No. 7400; Inverter gates 62, 90, and 106, Texas Instrument Ser. No. 7404.

Whereas the preferred form of the invention has been shown and described herein, it should be realized that there may be many modifications, substitutions, and alterations thereto without departing from the teachings of this invention.

Having described what is new and novel and desired to secure by letters patent what is claimed is:

1. The method of testing reed switch contacts, comprising the steps of:
   providing an ample flow of operating current through the operating winding of a reed switch under test;
   measuring the duration of each contact bounce when the contacts are open during a specified testing interval after the initial closure of the reed switch;
   comparing each measured contact bounce duration with a digitally programmed reference corresponding to an acceptable bounce duration; and
   providing an output indicating a rejection of said reed switch under test whenever any measured contact bounce duration exceeds the programmed reference duration.

2. The method of testing reed switch contacts as recited in claim 1 further comprising the step of operating and deactuating the reed switch under test for a predetermined repetitive number of cycles and indicating a rejection for any measured contact bounce duration which exceeds the reference duration during any of the test cycles.

3. A circuit for detecting non-parallel reed switch contacts of an operated reed switch under test, comprising:
   digital means for measuring the duration of each bounce or open contact state during a given calculation time period interval after closure of the reed switch contacts under test; and
   digital means for comparing each measured said open contact state duration with a digitally programmed reference duration corresponding to an acceptable bounce duration and providing an output indicating whenever any open contact state duration exceeds the reference duration.

4. The circuit for detecting non-parallel reed switch contacts as recited in claim 3 wherein said digital measuring means comprises counter means and a reference clock, said reference clock driving the clock input of said counter, the reset input of said counter means connected to monitor the contacts of said reed switch under test such that said counter means counts the reference clock when said reed switch contacts are in the open state after initial closure.

5. The circuit for detecting non-parallel reed switch contacts as recited in claim 4 further comprising pulse timing and gating means for monitoring said reed switch contacts under test and actuating said counter means, said pulse timing and gating means connected between said reed switch contacts under test and said counter means, said pulse timing and gating means further including timer means for resetting and enabling said counter means for the duration of each open contact bounce period after initial closure of said reed switch.

6. The circuit for detecting non-parallel reed switch contacts as recited in claim 3 further comprising reed switch operating means for repetitively operating and deactuating the reed switch under test for a predetermined number of test cycles.

7. The circuit for detecting non-parallel reed switch contacts as recited in claim 6 wherein said reed switch operating means comprises test oscillator means and test cycle counter means, said test oscillator means connected to operate and deactuate the reed switch under test, said test cycle counter means connected to count said test oscillator means and disable said test oscillator means after a programmed number of cycles.

8. The circuit for detecting non-parallel reed switch contacts as recited in claim 6 further comprising output latch circuitry means to provide an output indication of a reject level whenever any of the contact bounce durations during a predetermined number of test cycles exceeds the reference duration and to provide an accept level whenever none of the contact bounce durations exceeds the reference duration during a predetermined number of test cycles.

* * * * *